US005282253A

United States Patent [19]

Konomi

[11] Patent Number: 5,282,253

[45] Date of Patent: Jan. 25, 1994

[54] BONE CONDUCTION MICROPHONE MOUNT

[75] Inventor: Masao Konomi, Tokyo, Japan

[73] Assignee: Pan Communications, Inc., Tokyo, Japan

[21] Appl. No.: 660,815

[22] Filed: Feb. 26, 1991

[51] Int. Cl.[5] .......... H04R 25/00; H05K 5/00

[52] U.S. Cl. .......... 381/151; 381/68.6; 381/69; 181/135

[58] Field of Search .......... 381/151, 68.3, 68.6, 381/69; 181/135, 130

[56] References Cited

U.S. PATENT DOCUMENTS

| | | | |
|---|---|---|---|
| 2,874,231 | 2/1959 | Wallace | 381/68 |
| 3,448,224 | 6/1969 | Giller | 381/68.6 |
| 3,602,330 | 8/1971 | Johnson | 181/23 |
| 3,688,863 | 9/1972 | Johnson | 181/23 |
| 3,944,018 | 3/1976 | Satory | 181/33 R |
| 4,025,734 | 5/1977 | Aloupis | 381/151 |
| 4,064,362 | 12/1977 | Williams | 381/72 |
| 4,150,262 | 4/1979 | Ono | 381/68.3 |
| 4,156,118 | 5/1979 | Hargrave | 381/158 |
| 4,170,721 | 10/1979 | Ishibashi et al. | 381/155 |
| 4,321,432 | 3/1982 | Matsutani et al. | 381/174 |
| 4,323,999 | 4/1982 | Yoshizawa et al. | 369/19 |
| 4,392,244 | 7/1983 | Yoshizawa et al. | 455/79 |
| 4,407,389 | 10/1983 | Johnson | 181/135 |
| 4,440,982 | 4/1984 | Kaanders et al. | 381/69 |
| 4,476,353 | 10/1984 | Haertl | 381/68.6 |
| 4,516,428 | 5/1985 | Konomi | 73/585 |
| 4,588,867 | 5/1986 | Konomi | 381/151 |
| 4,696,045 | 9/1987 | Rosenthal | 381/151 |

FOREIGN PATENT DOCUMENTS

| | | | |
|---|---|---|---|
| 915826 | 7/1954 | Fed. Rep. of Germany . | |
| 0096788 | 7/1980 | Japan | 381/151 |
| 56-9000 | 1/1981 | Japan . | |
| 0080997 | 5/1983 | Japan | 381/151 |
| 794782 | 1/1981 | U.S.S.R. . | |
| 2079099A | 1/1982 | United Kingdom . | |

OTHER PUBLICATIONS

Hiroshi Ono, "Improvement and evaluation of the vibration pick-up-type ear microphone and two-way communication device," The Journal of the Acoustical Society of America, vol. 62, No. 3, Sep. 1977, pp. 760–768.

*Primary Examiner*—Jin F. Ng
*Assistant Examiner*—Jason Chan
*Attorney, Agent, or Firm*—Finnegan, Henderson, Farabow, Garrett & Dunner

[57] ABSTRACT

A bone conduction microphone which fits into the ear of the user and which has means which abuts against the pinna of the ear causing a counteracting force to resiliently push the device against a wall of the ear canal nearest the back of the head, where bone conducted vibrations are detected most efficiently.

3 Claims, 5 Drawing Sheets

BONE CONDUCTION MICROPHONE MOUNT

BACKGROUND OF THE INVENTION

The present invention relates generally to a bone conduction microphone which converts voice sound signals of the wearer into electrical signals for transmission. The voice sound signal is transmitted to the ear canal of the wearer in the form of bone conducted vibrations.

Although conventional ear microphones are designed to pick up vibrations by contacting the ear canal, they are normally not efficient. This inefficiency results because conventional ear microphones are inserted in the ear canal without touching the walled portion of the ear canal nearest the back of the head that emanates the highest level of bone conducted vibration. In addition, since conventional ear microphones are typically conically shaped, it is difficult to orient the ear microphone against the walled portion of the ear canal nearest the back of the head.

In conventional ear microphones, the inefficient detection of bone conducted vibrations requires greater signal amplification at a subsequent stage of signal processing. Accordingly, when conventional ear microphones are used for duplex voice communication, such as in a telephone system, the amount of required amplification makes the system more vulnerable to feedback.

Accordingly, an object of the present invention is to provide a bone conduction microphone which, when inserted in the ear, is situated against a wall of the ear canal nearest the back of the head in order to most efficiently detect bone conducted vibrations.

A further object of the present invention is to utilize the reactionary force caused by the resiliency of the pinna of the ear to position the bone conduction microphone against a wall of the ear canal nearest the back of the head.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the objects in accordance with the purposes of the present invention, as embodied and described herein, the bone conduction microphone mount of the present invention comprises a bone conduction microphone for mounting in the ear canal comprising an inside portion, with a vibration sensor located therein, situated in the ear canal, and an outside portion, attached to the inside portion, including means which abuts the pinna of the ear for resiliently pushing the inside portion of the microphone against a wall of the ear canal nearest the back of the head.

BRIEF DESCRIPTION OF THE DRAWINGS

The accompanying drawings, which are incorporated in and constitute a part of the specification, illustrate the presently preferred apparatus of the present invention and, together with the general description given above and the detailed description of the preferred embodiment given below serve to explain the principles of the invention. In the drawings.

DETAILED DESCRIPTION OF THE PREFERRED EMBODIMENTS

Figure 1:
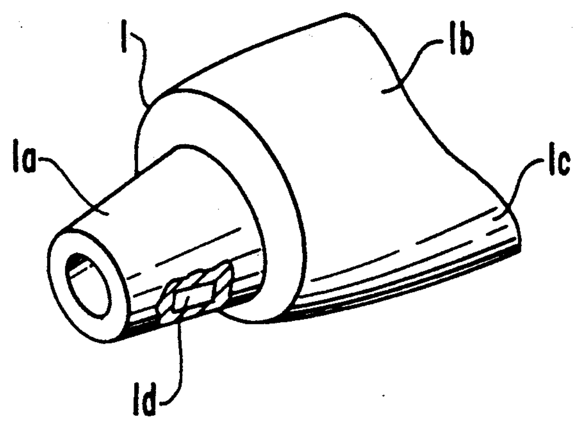
FIG. 1 is an orthogonal view of a first preferred embodiment of the present invention.

A first embodiment of the bone conduction microphone of the present invention is explained with reference to FIGS. 1-4. FIG. 1 is an orthogonal view of the first embodiment of the present invention. In FIG. 1, a bone conduction microphone 1 is shown having a configuration which facilitates insertion thereof into an ear canal. The inside portion la, which is inserted in the ear canal, is shaped like a conical frustum for a comfortable fit. Inside portion 1*a*, which has a vibration sensor located therein, as shown in the cut away portion is attached to the outside portion 1*b* which remains outside of the ear canal. The outside portion 1*b* includes an enlarged portion 1*c*. Enlarged portion 1*c* is configured so that when in use it pushes against the pinna, the extending rear portion of the outer ear, which is largely made up of cartilage.

Figure 2:
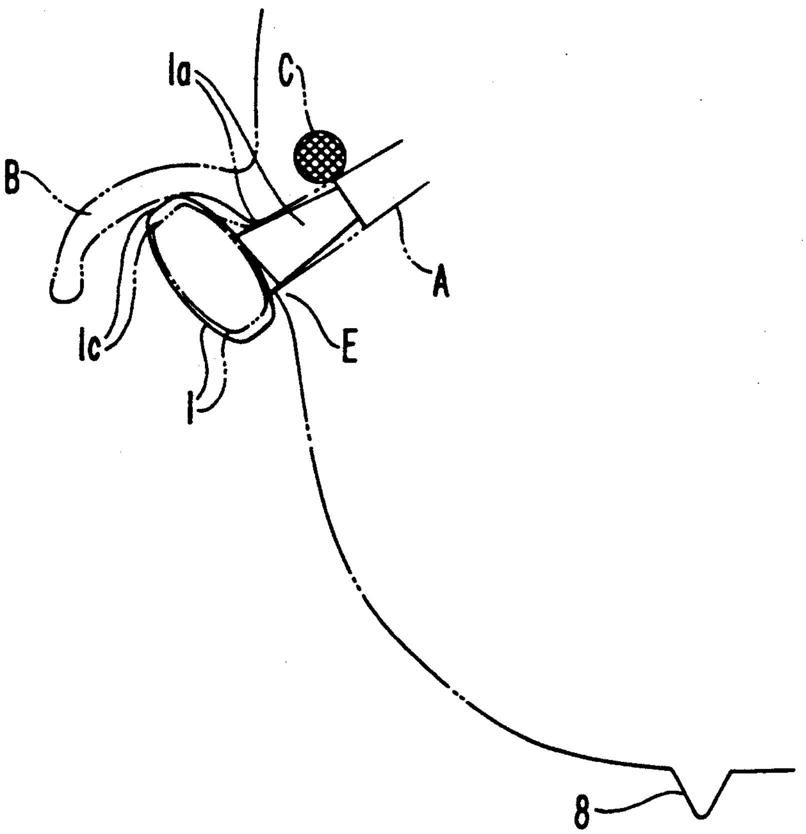
FIG. 2 is a cross sectional plan view of a head of a person showing the first embodiment of FIG. 1 inserted in an ear canal.

FIG. 2 is a cross sectional view of a head of a person showing bone conduction microphone 1 of the first embodiment of FIG. 1 inserted in an ear canal A. The nose 8 is shown at the front of the head. The pinna B is shown at the back of the ear, and a bone mass C is located behind the ear, and toward the back of the head. Bone mass C is adjacent the back wall of ear canal A. In FIG. 2, enlarged portion 1*c* of the bone conduction microphone 1 is shown abutting the pinna B when the inside portion 1*a* is inserted in the ear canal A.

Figure 3:
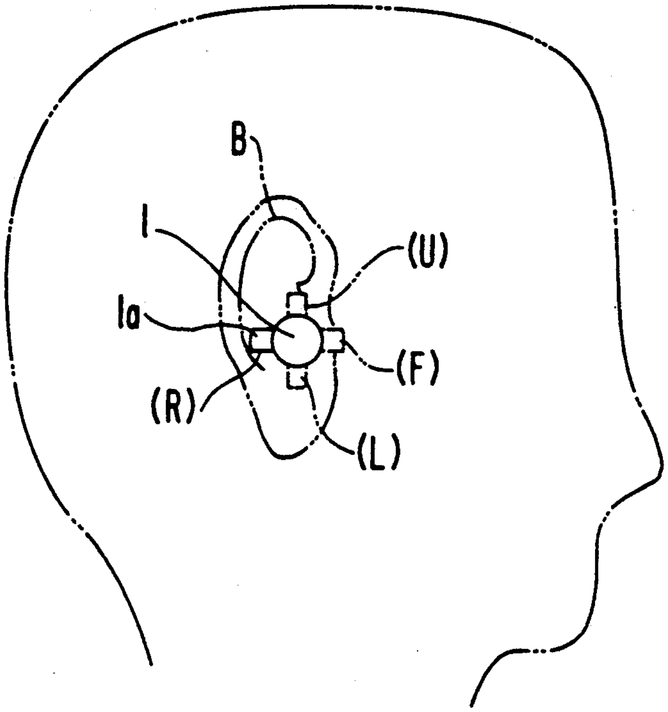
FIG. 3 is a side view of the bone conduction microphone, shown in FIG. 1, inserted in an ear canal for testing relative signal levels in four positions.

FIG. 3 is a side view of the bone conduction microphone 1 shown in FIG. 1, inserted sequentially into an ear canal A in four positions for testing relative signal levels. In FIG. 3, the four positions of insertion are shown to be the back of the head position R, the forward position F, the upper head position U, and the lower head position L. The signal strength of the bone conducted vibrations received at each of these positions when the user spoke was measured.

Figure 4:
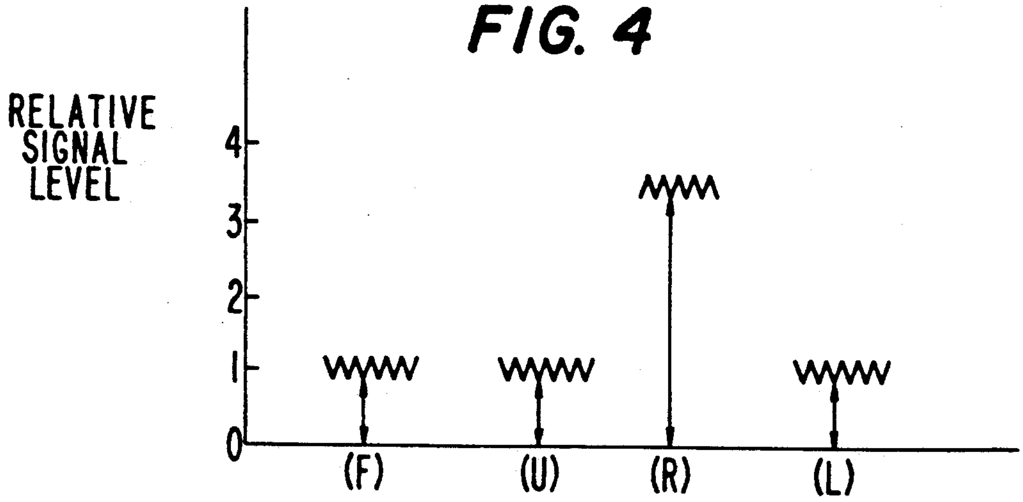
FIG. 4 is a graph comparatively showing the relative signal levels output from the bone conduction microphone inserted in each of the four positions shown in FIG. 3.

FIG. 4 is a graph comparatively showing the relative signal levels output from the bone conduction microphone 1 when it was inserted in each of the four positions shown in FIG. 3. In FIG. 4, the vertical axis represents the output levels of the bone conduction microphone 1. The horizontal axis represents the relative positioning of the bone conduction microphone 1 in the four positions shown in FIG. 3. FIG. 4 shows that the relative signal level of bone conducted human voice vibration detected by the bone conduction microphone 1 when it is in position R is more than two times that detected in positions F, U, and L.

To insert the bone conduction microphone 1 in position R, the enlarged portion 1*c* of the bone conduction microphone 1 is positioned to push the pinna B toward the back of the head of the user, as illustrated in FIG. 2. The pinna B is relatively resilient and exerts a force which counteracts the force exerted by enlarged portion 1*c* tending to restore itself to its original position. The resilient force of the pinna B rotates the bone conduction microphone 1 about the entrance E of ear canal A which acts as a pivot point. The tip of the inside portion 1*a* of the bone conduction microphone 1 is pushed toward the wall of ear canal A which is closest to bone mass C. As a result of the resiliency of the pinna, the bone conduction microphone 1 is inserted to cause the inside portion 1*a* of bone conduction microphone 1 to be in contact with the rear wall of the ear canal A to enable more efficient detection of bone conducted voices.

Using enlarged portion 1*c* to position the bone conduction microphone 1 in position R requires that the enlarged portion 1*c* be correctly sized so that it effectively meshes with the pinna B of the user. Users of the bone conduction microphone 1 will have different sized pinnas which will require that the enlarged portion 1*c* be customized for each user in order to achieve satisfactory reception of bone conducted vibrations. Sizing can be done with soft pliable materials to adjust for different ears, or a particular microphone can be formed for use with only one ear of a particular size.

Figure 5:
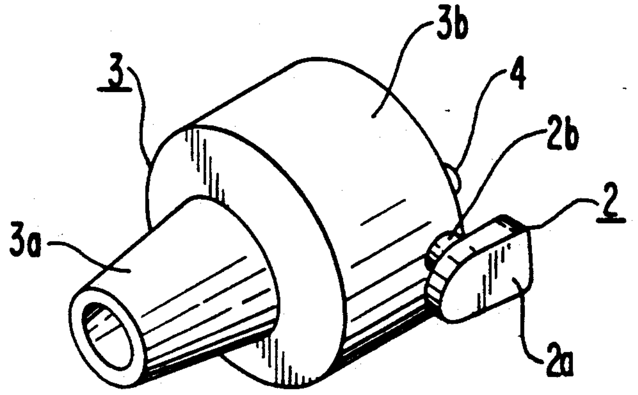
FIG. 5 is an orthogonal view of a second preferred embodiment of a bone conduction microphone of the present invention.

FIG. 5 is a side view of a second preferred embodiment of the bone conduction microphone of the present invention. The second preferred embodiment solves the above-mentioned problem of customizing the enlarged portion 1*c* by including an extendable portion 2 instead of enlarged portion 1*c*. The extendable portion 2 preferably consists of an ear pad 2*a* and a movable cylinder 2*b*. The bone conduction microphone 3, shown in FIG. 5, also includes a conical frustum shaped inside portion 3*a* which has a vibration sensor housed therein. Inside portion 3*a* fits into the ear canal and is attached to outside portion 3*b*.

Figure 6:
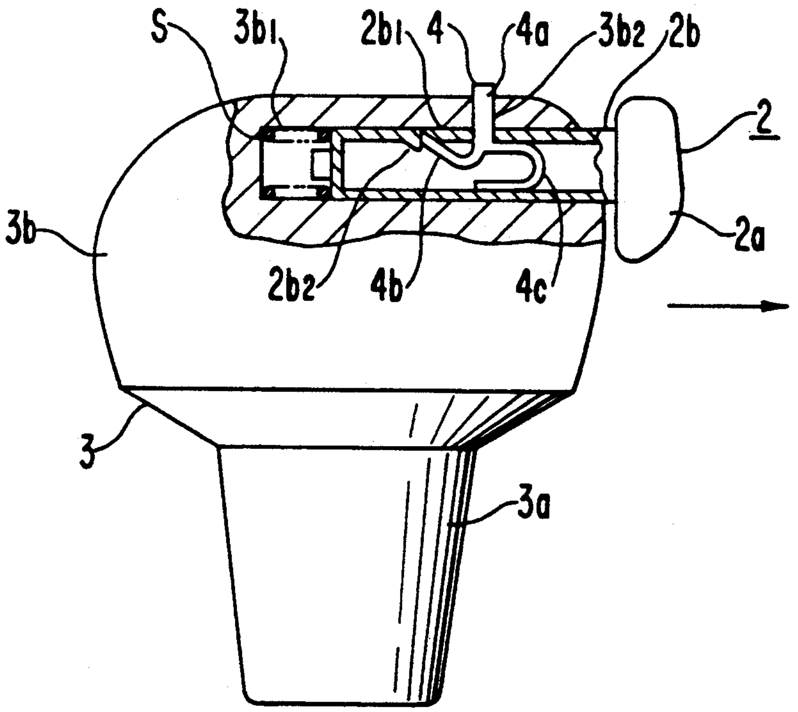
FIG. 6 is a partial cross sectional view of the second embodiment shown in FIG. 5.

FIG. 6 is a detailed cross sectional view of the second preferred embodiment of the bone conduction microphone shown in FIG. 5. FIG. 6 shows outside portion 3*b* which includes bore 3*b*1 bored therein which houses moveable cylinder 2*b*. Bore 3*b*1 also houses a spring S which is attached to the bore 3*b*1 at one end. The other end of the spring S is attached to one end of the moveable cylinder 2*b*. The spring S tends to push the moveable cylinder 2*b* out of bore 3*b*1, when the spring S is released.

The cylinder 2*b* also has a stopper 4 fitted inside of it. The stopper 4 consists of a stopper release knob 4*a*, a stopper nail 4*b*, and a stopper spring 4*c*. The stopper release knob 4*a* protrudes from a hole in the moveable cylinder 2*b* and a hole 3*b*2 in the outside portion 3*b*. The hole 3*b*2 is bored at one end of the outside portion 3*b* of the bone conduction microphone 3. The stopper 4 is preferably made of flexible plastic. When the stopper release knob 4*a* is pushed, the stopper nail 4*b* is lowered due to the flexible nature of the stopper spring 4*c*. When the stopper nail 4*b* is lowered, it is released from cylinder edge portion 2*b*2. Upon release of the stopper nail 4*b*, the moveable cylinder 2*b* is released and is pushed along bore 3*b*1 by spring S. Ear pad 2*a* is therefore moved in the direction of the arrow shown in FIG. 6.

In order to fit the bone conduction microphone 3, the user inserts the bone conduction microphone 3 into his or her ear canal and pushes the stopper release knob 4*a*. As a result, the ear pad 2*a* is pushed by the spring S toward and abutting with the pinna of the user. Since the pinna is pushed back by the ear pad 2*a*, the resilient force of the pinna causes the inside portion 3*a* of the bone conduction microphone 3 to contact the wall of the ear canal A in the position R, as explained with respect to the first preferred embodiment of the present invention shown in FIG. 1.

Figure 7:
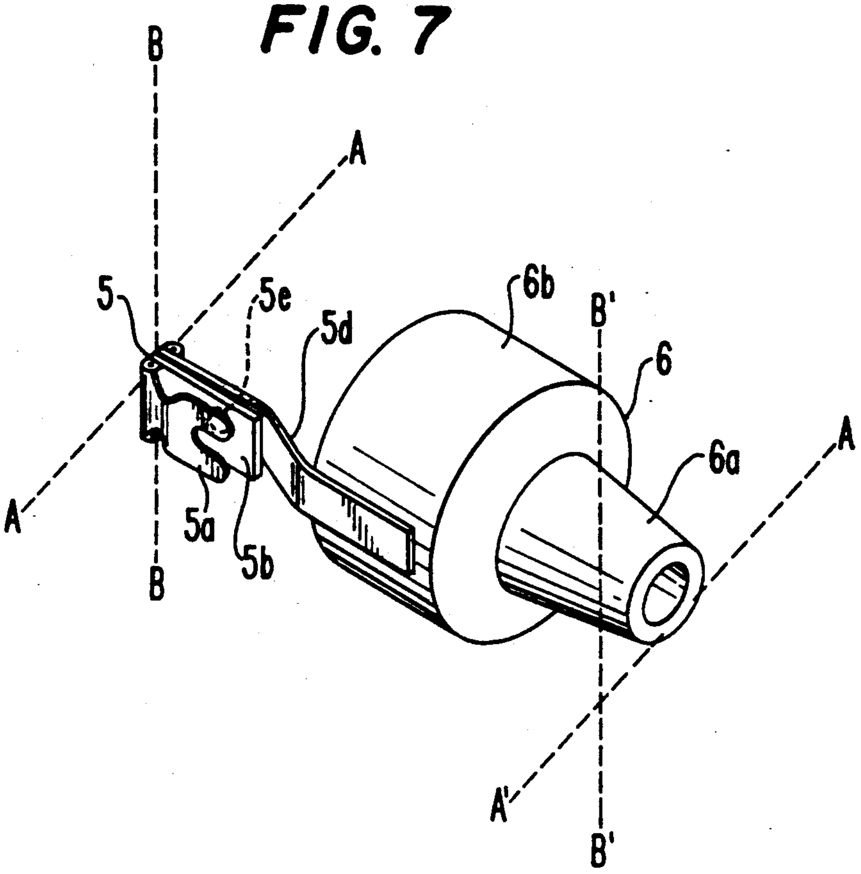
FIG. 7 is an orthogonal view of a third preferred embodiment of a bone conduction microphone of the present invention.

FIG. 7 is an orthogonal view of a third preferred embodiment of the bone conduction microphone of the present invention. The bone conduction microphone 6 is shown having a configuration that facilitates insertion into the ear canal. The inside portion 6*a* has a conical frustum shape for fitting into an ear canal and has a vibration sensor located therein. Inside portion 6*a* is attached to outside portion 6*b* which when in use contacts the separate pinna piece 5. In the third preferred embodiment of the present invention shown in FIG. 7, the pinna piece 5 is of separate construction. The pinna piece 5 is attached at the rim of the pinna of the ear and preferably consists of a rim holder 5*a*, a center piece 5*b*, a spring 5*c*, an arm 5*d* and a stopper 5*e*.

Figure 8:
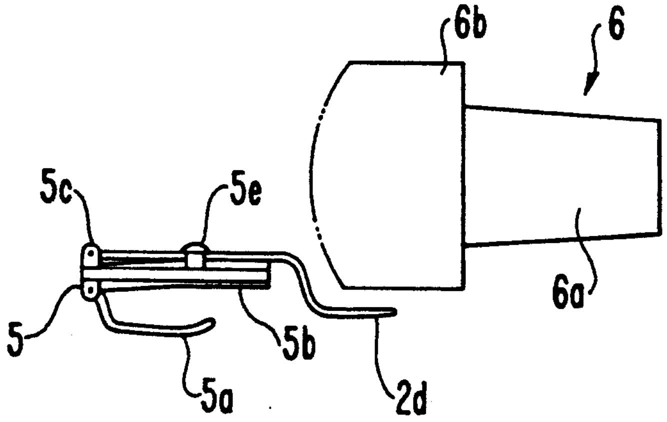
FIG. 8 is a detailed view of the pinna piece taken along a plane defined by A—A, A'—A' of FIG. 7.

FIG. 8 is a detailed view of the pinna piece taken along a plane defined by A—A and A'—A' of FIG. 7. As shown in FIG. 8, the rim holder 5*a* and the center piece together preferably have a mechanism similar to that of a non-pierced earring attached to an ear lobe. Accordingly, the rim holder 5*a* and the center piece 5*b* close by being pushed together and hold a rim of the pinna between them. The user unfastens pinna piece 5 from the rim of the pinna by prying open rim holder 5*a* from center piece 5*b*.

On the opposite side of the center piece 5*b* from the rim holder 5*a*, there is situated a stopper 5*e*. Stopper 5*e* is preferably made of rubber and holds an arm 5*d*. The arm 5*d* is also attached to the spring 5*c*. The spring 5*c* includes a spring mechanism which, as a result of its resiliency tends to open the arm 5*d* when it is not restricted by the stopper 5*e*. When the user attaches the rim piece 5*a* and the center piece 5*b* to the pinna, the stopper 5*e* holds the arm 5*d* in place. After the pinna piece 5 is attached to the rim of the pinna, the arm 5*d* is released by bending the stopper 5*e*. The release of arm 5*d* causes the front portion 6*a* of the bone conduction microphone 6 to be properly situated in the ear canal against the rear portion of the ear canal A adjacent bone mass C.

Figure 9:
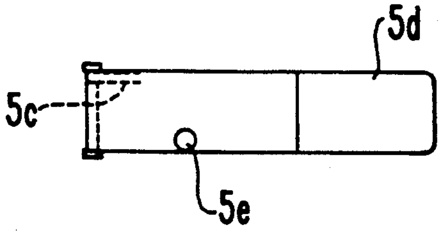
FIG. 9 is a frontal view of the third embodiment taken along a plane defined by B—B, B'—B' of FIG. 7.

FIG. 9 is a frontal view of the third embodiment taken along the plane defined by B—B, B'—B' of FIG. 7. FIG. 9 shows spring 5*c* which extends along arm 5*d*. The spring 5*c* urges the arm 5*d*, which is attached to the bone conduction microphone 6, when the stopper 5*e* is bent.

Figure 10:
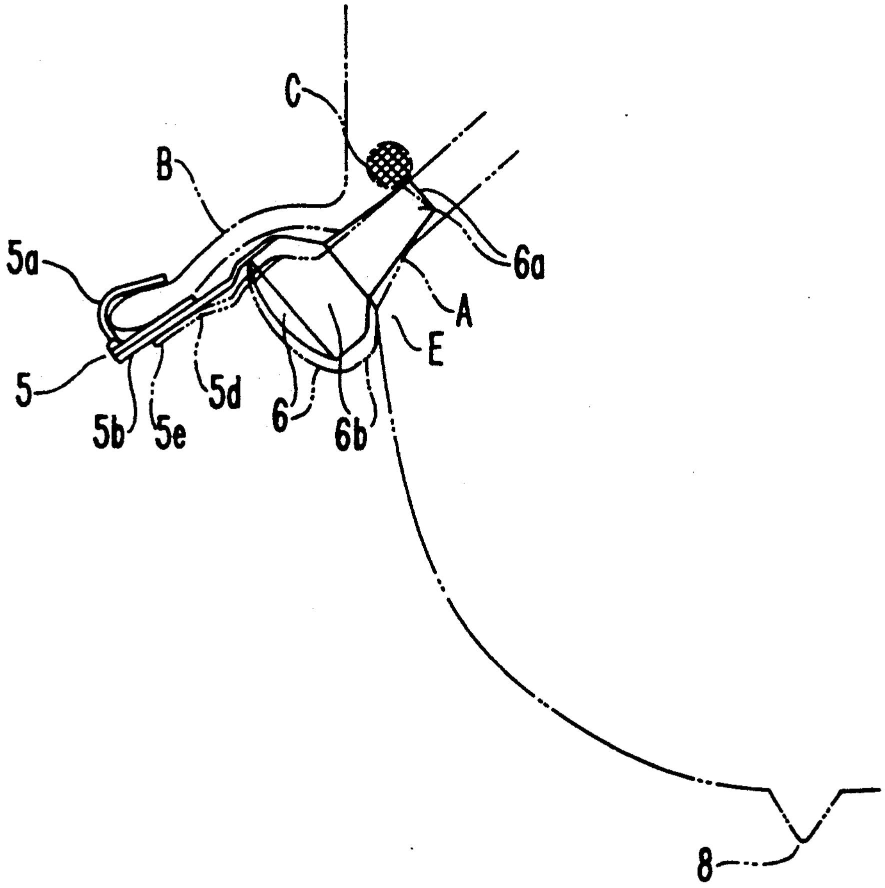
FIG. 10 is a cross sectional view of a head of a person showing the third embodiment of the bone conduction microphone of FIG. 7 inserted in an ear canal.

FIG. 10 is a cross sectional view of a head of a person showing the third embodiment of FIG. 7 inserted in the ear canal A. In order to fit the bone conduction microphone 6 into ear canal A, the user inserts the inside portion 6a into ear canal A and attaches the separate pinna piece 5 to the rim of the pinna B with the arm 5d held by the stopper 5e. By bending the stopper 5e, arm 5d is released and pushes the outside portion 6b of the bone conduction microphone 6 toward the front part of the user's face. As a result, the bone conduction microphone 6 is forced by the reflexive force of the pinna B to pivot at the entrance E of the ear canal A. The inside portion 6a of the bone conduction microphone 6 is thus pushed into position R, to abut against the ear canal A near bone mass C, as described with respect to the first preferred embodiment of the present invention shown in FIG. 1.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A bone conduction microphone, for use in an ear, comprising:

an inside portion, with a vibration sensor located therein, for insertion in the ear canal; and an outside portion, attached to the inside portion, including means, adapted to abut the pinna of the ear, for resiliently pushing the inside portion against a wall of the ear canal nearest the back of the head when inserted in the ear, wherein the means is integral with the outside portion and comprises:

a spring, releasably mounted in a bore in the outside portion; and a pad, coupled to the spring, which abuts and exerts a force against the pinna when the spring is released.

2. A bone conduction microphone, for use in an ear, comprising:

an inside portion, with a vibration sensor located therein, for insertion in the ear canal; and an outside portion, attached to the inside portion, including means, adapted to abut the pinna of the ear, for resiliently pushing the inside portion against a wall of the ear canal nearest the back of the head when inserted in the ear, wherein the means is separable from the outside portion and comprises:

an arm, separate from and contacting the outside portion;

a spring attached to the arm;

a pinna fitting, attached to the spring, for attaching the bone conduction microphone to a rim of the pinna; and a release causes the spring to push the arm.

3. The bone conduction microphone as recited in claim 2, wherein the pinna fitting comprises a rim holder and a center piece which releasably attach to the rim of the pinna.

* * * * *

UNITED STATES PATENT AND TRADEMARK OFFICE

CERTIFICATE OF CORRECTION

PATENT NO. : 5,282,253

DATED : January 25, 1994

INVENTOR(S) : Konomi

It is certified that error appears in the above-identified patent and that said Letters Patent is hereby corrected as shown below:

Claim 2, column 6, line 25, after "release", insert --mechanism, releasably attached to the arm, which, on release--.

Signed and Sealed this

Twenty-eighth Day of June, 1994

Attest:

BRUCE LEHMAN

Attesting Officer

*Commissioner of Patents and Trademarks*